(12) United States Patent
Furuie et al.

(10) Patent No.: US 7,705,531 B2
(45) Date of Patent: Apr. 27, 2010

(54) ORGANIC ELECTROLUMINESCENT DISPLAY DEVICE WITH A LIGHT SHIELDING MEMBER ARRANGED ON AN END WALL FACE OF A PERIPHERY OF THE SUBSTRATE

(75) Inventors: Masamitsu Furuie, Mobara (JP); Shinichi Kato, Mobara (JP); Masaaki Okunaka, Mobara (JP); Masato Ito, Mobara (JP); Hirotsugu Sakamoto, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 0 days.

(21) Appl. No.: 10/897,101

(22) Filed: Jul. 23, 2004

(65) Prior Publication Data
US 2005/0035709 A1 Feb. 17, 2005

(30) Foreign Application Priority Data
Aug. 11, 2003 (JP) ............................... 2003-291489

(51) Int. Cl.
*H01J 63/04* (2006.01)
(52) U.S. Cl. .................................................. 313/506
(58) Field of Classification Search ......... 313/498–512; 445/24
See application file for complete search history.

(56) References Cited
U.S. PATENT DOCUMENTS

| | | | | |
|---|---|---|---|---|
| 5,661,364 A * | 8/1997 | Kruskopf | .................... 313/512 |
| 5,739,880 A * | 4/1998 | Suzuki et al. | ............... 349/110 |
| 5,946,078 A * | 8/1999 | Morimoto et al. | ............. 355/30 |
| 6,118,509 A * | 9/2000 | Miyake | ...................... 349/153 |
| 6,120,858 A * | 9/2000 | Hirano et al. | .............. 428/1.53 |
| 6,275,279 B1 * | 8/2001 | Asuma et al. | ............... 349/153 |
| 6,326,936 B1 * | 12/2001 | Inganas et al. | ................ 345/55 |
| 6,537,688 B2 * | 3/2003 | Silvernail et al. | ........... 428/690 |
| 6,576,351 B2 * | 6/2003 | Silvernail | ................... 428/690 |
| 6,686,063 B2 * | 2/2004 | Kobayashi | .................. 428/690 |
| 2002/0068191 A1 * | 6/2002 | Kobayashi | .................. 428/690 |
| 2002/0088985 A1 * | 7/2002 | Komoto et al. | ................ 257/99 |
| 2002/0093284 A1 * | 7/2002 | Adachi et al. | .............. 313/506 |
| 2004/0119401 A1 * | 6/2004 | Lee et al. | .................... 313/504 |
| 2004/0178723 A1 * | 9/2004 | Yasukawa et al. | ........... 313/506 |
| 2004/0257352 A1 * | 12/2004 | Naugler et al. | .............. 345/204 |

* cited by examiner

*Primary Examiner*—Toan Ton
*Assistant Examiner*—Hana A Sanei
(74) *Attorney, Agent, or Firm*—Stites & Harbison PLLC; Juan Carlos A. Marquez, Esq.

(57) ABSTRACT

In an organic electroluminescent display device having light emitting layers which are independently controlled and emit light formed in respective pixel regions on a principal surface of a substrate and emitting light from each of the light emitting layer through the substrate, the present invention arranges a light shielding member on an end wall face of the substrate and prevents the light from leaking from the end wall face thereof.

7 Claims, 4 Drawing Sheets

ORGANIC ELECTROLUMINESCENT DISPLAY DEVICE WITH A LIGHT SHIELDING MEMBER ARRANGED ON AN END WALL FACE OF A PERIPHERY OF THE SUBSTRATE

The present application claims priority from Japanese application JP 2003-291489 filed on Aug. 11, 2003, the content of which is hereby incorporated by reference into this application.

BACKGROUND OF THE INVENTION

1. Field of the Invention

The present invention relates to an organic EL (electroluminescent) display device, and more particularly to an organic EL display device to which improvements are made with respect to a cell thereof.

2. Description of the Related Art

In the organic EL display device, a display part formed on one surface of a substrate thereof is constituted of respective pixels which are arranged in a matrix array and a pixel region of each pixel is provided with an organic EL layer (a light emitting layer) which emits light when an electric current flows therein.

Further, on a surface of the substrate on which the light emitting layers are formed, another substrate which is arranged to face the substrate in an opposed manner is fixed to the substrate by way of a sealing material which is formed in a state that the sealing material surrounds the display part thus constituting a cell.

Since the characteristics of the organic EL layers are changed due to oxygen, moisture and the like, the cell is provided for shielding the organic EL layers from the outside air.

Light from the light emitting layer passes through at least one of substrates out of the above-mentioned respective substrates and is irradiated to a viewer's side and hence, one substrate is formed of a transparent substrate made of glass or the like (see patent document 1).

[patent document 1]
Japanese Patent Application (Laid-Open) Hei11(1999)-219782

SUMMARY OF THE INVENTION

However, with respect to the organic electroluminescent display device having the above-mentioned constitution in which the light emitting layers are formed on the substrate and the light emitted from the light emitting layer is irradiated through the substrate, the light which is irradiated to the substrate side in the direction perpendicular to the substrate or in the direction making a slight angle with respect to the direction passes through the substrate and reaches the viewer's side. However, light other than the above-mentioned light is totally reflected on a surface of the substrate and is guided to an end wall face side of the substrate.

Accordingly, leaked light from the substrate is observed with naked eyes at the end wall face and there has been a demand for a countermeasure to cope with the leaking of light.

The present invention has been made in view of such circumstances and it is an object of the present invention to provide an organic EL display device which can obviate the leaking of light from an end wall face of a cell.

To briefly explain the summary of representative inventions among the inventions disclosed in the present application, they are as follows.

(1) The organic electroluminescent display device according to the present invention is, for example, characterized in that a light emitting layer which is controlled independently and emits light is formed on each pixel region on one surface of a substrate, light from the light emitting layer is irradiated through the substrate, and a light shielding member is arranged on an end wall face of a periphery of the substrate.

(2) The organic electroluminescent display device according to the present invention, for example, comprises a first substrate and a second substrate which faces a display part of the first substrate on which light emitting layers are formed in an opposed manner and is fixed to the first substrate using a sealing material which surrounds the display part, wherein a light shielding member is arranged on respective end wall faces of the first substrate and the second substrate.

(3) The organic electroluminescent display device according to the present invention is, for example, on the premise of either one of the constitutions (1) and (2), characterized in that the light emitting layer is formed on a portion of each pixel region and a bank layer is formed between the light emitting layer and the light emitting layer of another pixel region arranged close to the light emitting layer, and the bank layer is extended to an end wall face of the substrate and constitutes the light shielding member.

(4) The organic electroluminescent display device according to the present invention is, for example, characterized in that a light emitting layer which is controlled independently and emits light is formed on each pixel region on one surface of a substrate, light from the light emitting layer is irradiated through the substrate, a light shielding member is arranged on an end wall face of a periphery of the substrate, an optical sensor is arranged between a portion of the end wall face and the light shielding member, and an electric current which is made to flow into the light emitting layer is controlled in response to an output of the optical sensor.

(5) The organic electroluminescent display device according to the present invention is, for example, characterized in that a light emitting layer which is controlled independently and emits light is formed on each pixel region on one surface of a substrate, light from the light emitting layer is irradiated through the substrate, a light shielding member is arranged on an end wall face of a periphery of the substrate, a solar cell is arranged between a portion of the end wall face and the light shielding member, and an output of the solar cell is used for driving the light emitting layer.

(6) The organic electroluminescent display device according to the present invention is, for example, on the premise of any one of the constitutions (1), (2), (3), (4) and (5), characterized in that the light shielding member is a resin member.

(7) The organic electroluminescent display device according to the present invention is, for example, on the premise of any one of the constitutions (1), (2), (3), (4) and (5), characterized in that the light shielding member is an adhesive tape.

(8) The organic electroluminescent display device according to the present invention is, for example, on the premise of any one of the constitutions (1), (2), (3), (4) and (5), the light shielding member is formed by extending a material formed on the substrate to an end wall face of the substrate.

Here, the present invention is not limited to the above-mentioned constitutions and various modifications are conceivable without departing from the technical concept of the present invention.

According to the above-mentioned constitution (1), with respect to light emitted from the light emitting layer, it is possible to prevent light which is irradiated upon total reflection in the inside of the substrate from being leaked from an end wall face of the substrate.

According to the above-mentioned constitution (2), it is possible to prevent leaking of light from end side faces of the respective substrates which constitute an envelope of the cell.

According to the above-mentioned constitution (3), with respect to the organic EL display device which forms the bank layers on one substrate side, it is possible to prevent leaking of light from end wall face of the substrate without particularly using other material.

According to the above-mentioned constitution (4), it is possible to provide the sensor which is used for controlling the light from the light emitting layer by feedbacking the light without forming a particular region.

According to the above-mentioned constitution (5), it is possible to reutilize the light which is originally wasted.

According to the above-mentioned constitution (6), it is possible to easily form the light shielding member by a so-called coating operation.

According to the above-mentioned constitution (7), it is possible to form the light shielding member without using a fixing material.

According to the above-mentioned constitution (8), it is possible to prevent leaking of light from an end wall face of the substrate in a reliable manner.

DETAILED DESCRIPTION

Hereinafter, embodiments of an organic EL display device according to the present invention are explained in conjunction with drawings.

<<Whole Constitution>>

Figure 2:
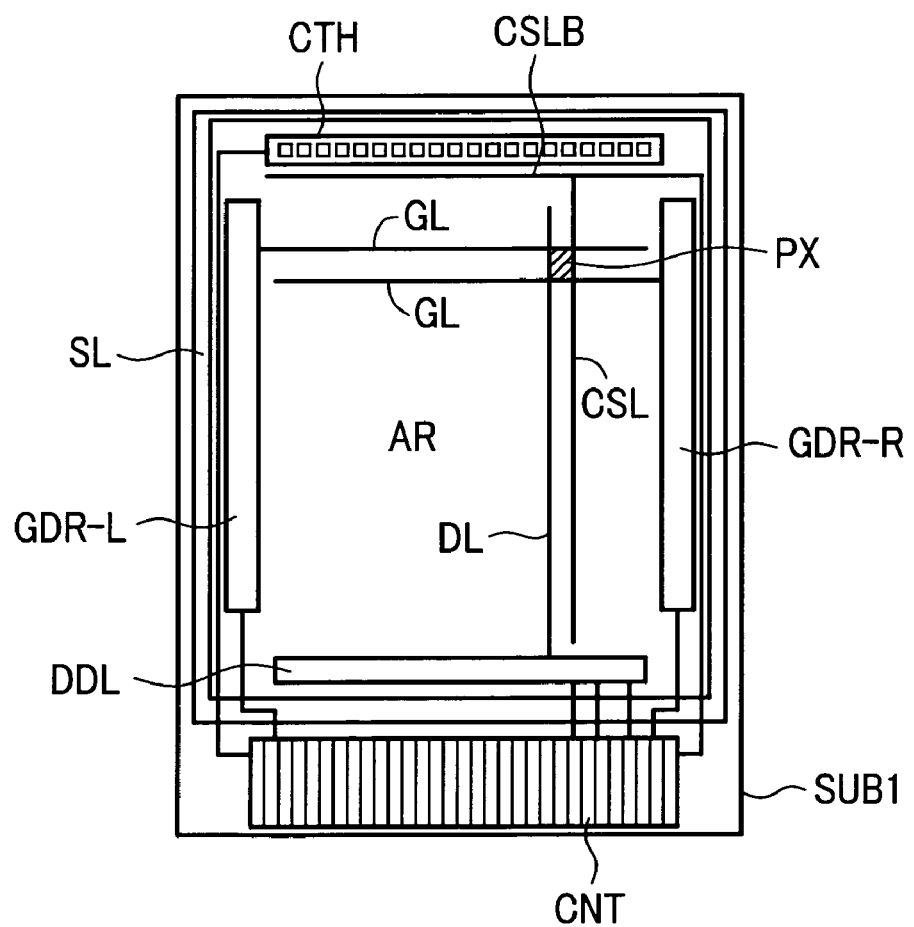
FIG. 2 is a plan view showing one embodiment of an organic EL display device according to the present invention.

FIG. 2 is a plan view of an organic EL display device according to the present invention and is a view which shows the constitution of an another-substrate-side surface of one substrate SUB1 out of the respective substrates which are arranged to face each other in an opposed manner.

First of all, a display region AR is formed on a most portion of the center of a substrate SUB1. Scanning signal drive circuits GDR-L, GDR-R are respectively arranged at both left and right sides of the display region AR. Gate signal lines GL extend toward the display region AR side from the respective scanning signal drive circuits GDR-L, GDR-R. The gate signal lines GL-L from the scanning signal drive circuit GDR-L and the gate signal lines GL-R from the scanning signal drive circuit GDR-R are arranged alternately.

Further, a data signal drive circuit DDL is arranged at a lower side of the display region AR and data signal lines DL extend toward the display region AR side from the data signal drive circuit DDL. Further, a current supply bus line CSLB is arranged at an upper side of the display region AR and current supply lines CSL extend toward the display region AR side from the current supply bus line CSLB.

The data signal lines DL and the current supply lines CSL are arranged alternately. Accordingly, one pixel PX is formed in each region surrounded by the data signal line DL, the current supply line CSL and the gate signal line GL-L and the gate signal line GL-R.

A sealing material SL is formed in a state that the sealing material SL surrounds the display region AR, the scanning signal drive circuits GDR-L, GDR-R, the video signal drive circuit DDL and the current supply bus line CSLB and the sealing material SL is served for fixing other substrate which is arranged to face the above-mentioned substrate SUB in an opposed manner. A light emitting layer made of organic EL is formed on each pixel region. Since the light emitting layer exhibits the deterioration of characteristics thereof due to oxygen, moisture and the like, the light emitting layer is shielded from the outside air.

Outside the sealing material SL and on a lower-side surface of the substrate SUB, a terminal group CNT which is constituted of a plurality of terminals is formed, and signals are supplied to the above-mentioned scanning signal drive circuits GDR-L, GDR-R, the video signal drive circuit DDL and the current supply bus line CSLB from the terminal group CNT.

Here, in the drawing, symbol CTH indicates a contact region for connecting a conductive layer which is commonly formed for respective pixels on an upper layer and a wiring layer which is formed below the conductive layer by way of an insulation film. Here, the conductive layer has a function of a cathode which constitutes one electrode of the light emitting layer which is formed in the inside of each pixel of the display region AR.

<<Constitution of Pixel>>

Figure 3A:
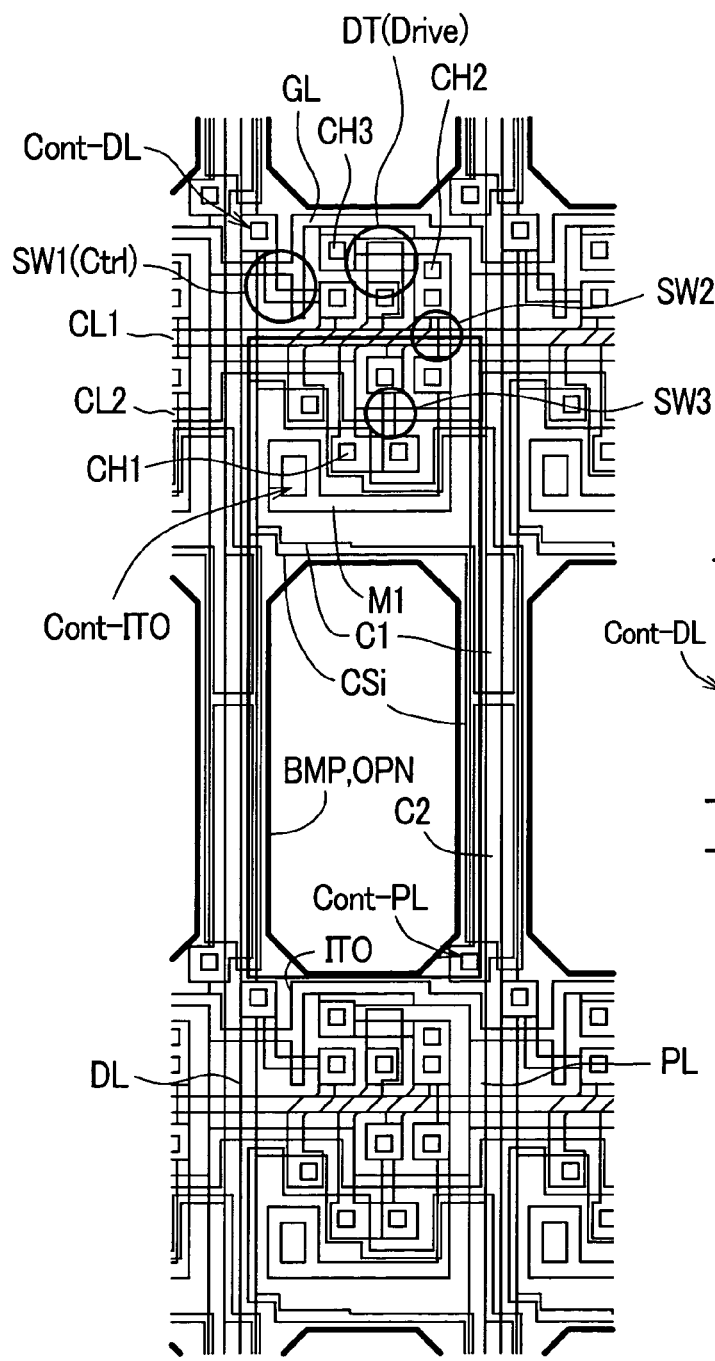
FIGS. 3A and 3B are constitutional views showing one embodiment of the constitution of a pixel of the organic EL display device according to the present invention.

FIG. 3(a) is a plan view showing the detail of the above-mentioned pixel PX. A minute circuit is incorporated in each pixel by stacking a conductive layer, a semiconductor layer, an insulation layer and the like which are formed in a given pattern.

That is, with respect to one pixel, in the drawing, an upper side thereof is defined by the gate signal line GL which selectively drives the pixel, a left side thereof is defined by the drain signal line DL which supplies video signals to the pixel, a right side thereof is defined by the current supply line CSL which supplies an electric current to the pixel, and a lower side thereof is defined by the gate signal line GL which selectively drives another pixel neighboring to the pixel.

The region of one pixel is divided into an upper-side region and a lower-side region in the drawing, wherein the light emitting layer made of organic EL is formed on the lower-side region and a circuit for generating an electric current corresponding to the video signals is formed on the upper-side region.

In the above-mentioned region on which the light emitting layer is formed, for example, one electrode (indicated by ITO in the drawing) formed of a light transmitting conductive layer, the light emitting layer and another electrode are sequentially stacked from the substrate side. The light emitting layer is formed in a state that the light emitting layer is embedded in an opening portion (BMP, OPN in the drawing) of the bank layer BMP which is formed above the above-mentioned one electrode, and this portion is substantially constituted as a light emitting portion. Further, another electrode is formed in common with the respective pixels in a state that another electrode also covers an upper surface of the above-mentioned bank layer BMP.

By assuming one electrode as an anode and another electrode as a cathode and by supplying an electric current to the light emitting layer therebetween, the light emitting layer emits light with an intensity corresponding to the electric current. Here, the above-mentioned bank layer BMP is formed to obviate the transmission of emitted light from the pixel to the inside of the neighboring pixel or to form the light emitting layer which originally has fluidity in the manufacturing process into a shape having a given profile. Accordingly, when the above-mentioned bank layer BMP is formed of a resin material, for example, the bank layer BMP which contains a black pigment or the like in the resin material is used.

On the above-mentioned region formed in the above-mentioned circuit, switching elements SW1, SW2, SW3, a control signal line CL1 which turns on and off the switching element SW2, a control signal line CL2 which turns on and off the switching element SW3, a drive transistor DT, and discharge capacitance elements C1-CSi, CSi-CS2 are formed.

The circuit is configured such that the video signal is fetched from the drain signal line DL in response to the scanning signal from the gate signal line GL, and an electric current from the current supply line CSL is supplied to one electrode in the region where the light emitting layer is formed in response to the magnitude (voltage) of the video signal.

Here, the above-mentioned switching elements SW2, SW3 and the capacitance elements Csi-C2 are provided for, when the threshold-value voltages of the drive transistors DT vary for respective pixels, correcting the irregularities of the threshold-value voltages.

<<Equivalent Circuit>>

Figure 3B:
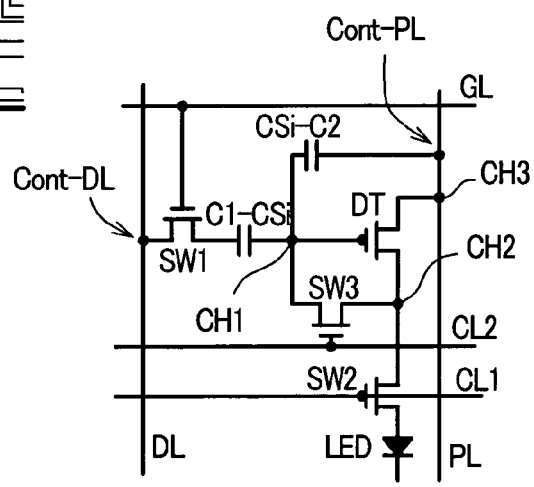

FIG. 3B shows an equivalent circuit for the above-mentioned one pixel and is depicted in accordance with the geometric arrangement in FIG. 3A.

In response to the scanning signal from the gate signal line GL, the switching element SW1 is turned on and the video signal from the drain signal line DL is supplied to one electrode C1 of the capacitance element C1-Csi through the switching element SW1. Here, another electrode of the capacitance element C1-Csi is held in a floating state.

Here, the capacitance element C1-Csi has a function of holding the gate potential of the drive transistor DT having the gate electrode which assumes the equal potential as another electrode of the capacitance element C1-Csi at a given value for a given period.

In such a state, first of all, a control signal transmitted through the control signal line CL1 turns on the switching element SW2. Here, although the drive transistor DT is not turned on, a node-CH2 side of the drive transistor DT is connected to the reference potential through the organic EL element LED from a floating state and the potential of the drive transistor DT is elevated to a given value.

Next, a control signal transmitted through the control signal line CL2 turns on the switching element SW3 corresponding to the control signal line CL2. Accordingly, one electrode CSi of the capacitance element CS1-C2 held in the floating state is connected with the node-CH2 side of the drive transistor DT through the switching element SW3 and the potential of the drive transistor DT is elevated to the above-mentioned given value. Here, since the gate potential (the potential of a node CH1) of the drive transistor DT is equal to the potential of the output side (the node CH2) and hence, a channel layer of the drive transistor DT interrupts the flow of charges.

Since a given electric current flows in the current supply line CSL irrelevant to the video signal transmitted through the drain signal line DL, the potential of the current supply line CSL is substantially fixed. Accordingly, by sequentially turning on two switching elements SW2, SW3 (sequentially bringing their respective channel layers into a conductive state), the substantially same quantity of charges are stored in the capacitance element CS1-C2 of any pixel.

When a channel layer of the switching element SW3 is closed and, thereafter, the switching element SW1 is turned on in such a state, corresponding to the voltage (the video signal) applied to one electrode C1 of the capacitance element C1-CSi, the capacitance of the capacitance element C1-CSi is also changed. Then, corresponding to the change of the capacitance element C1-CSi, the difference is generated between the potential of the node CH1 (the gate potential of the drive transistor DT) and the potential of the output side (the node CH2 side).

Due to this difference in potential, the drive transistor DT is turned on and the quantity of charge which flows into the turned-on channel is controlled so as to allow the organic EL element LED to emit light with desired luminance.

<<Constitution of cell>>

Figure 1:
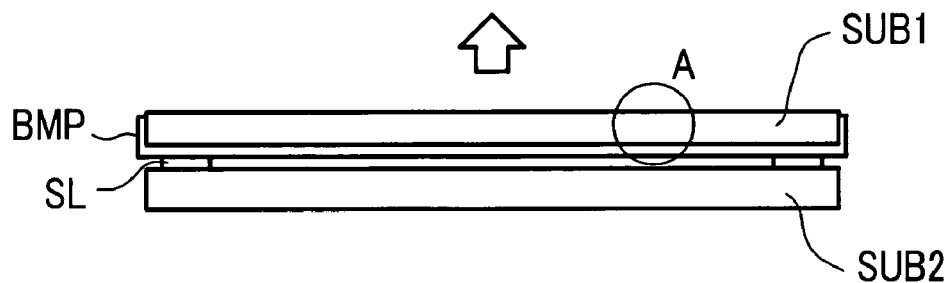
FIG. 1 is a cross-sectional view showing one embodiment of an organic EL display device according to the present invention.

FIG. 1 is a side view showing a cell of an organic EL display device which is formed by assembling the substrate SUB1 which is constituted in the above-mentioned manner and the substrate SUB2 which is arranged to face the substrate SUB1 in an opposed manner and is fixed to the substrate SUB1 using the sealing material SL.

Light emitted from the light emitting layer which is formed on a substrate-SUB2-side surface of the substrate SUB1 passes through the substrate SUB1 and is irradiated to the viewer's side.

Here, in the drawing, only the bank layer BMP is shown out of the stacked body which is formed on the substrate-SUB2-side surface of the substrate SUB1 and is constituted of the conductive layer, the semiconductor layer and the insulation layer, wherein the bank layer BMP is formed in a state that the bank layer BMP extends to the periphery of the substrate SUB1 and also covers the end wall face of the substrate SUB1.

That is, the cell is configured to shield the end wall face of the substrate SUB1 from light using the bank layer BMP. In other words, the bank layer BPM is configured to also function as a light shielding member which shields the end wall face of the substrate SUB1 from light.

The above-mentioned constitution is provided for obviating the phenomenon that the light from the light emitting layer is incident on the inside of the substrate SUB1 and is leaked and is irradiated while being leaked from the end wall face of the substrate SUB1 using the light shielding member.

Figure 4:
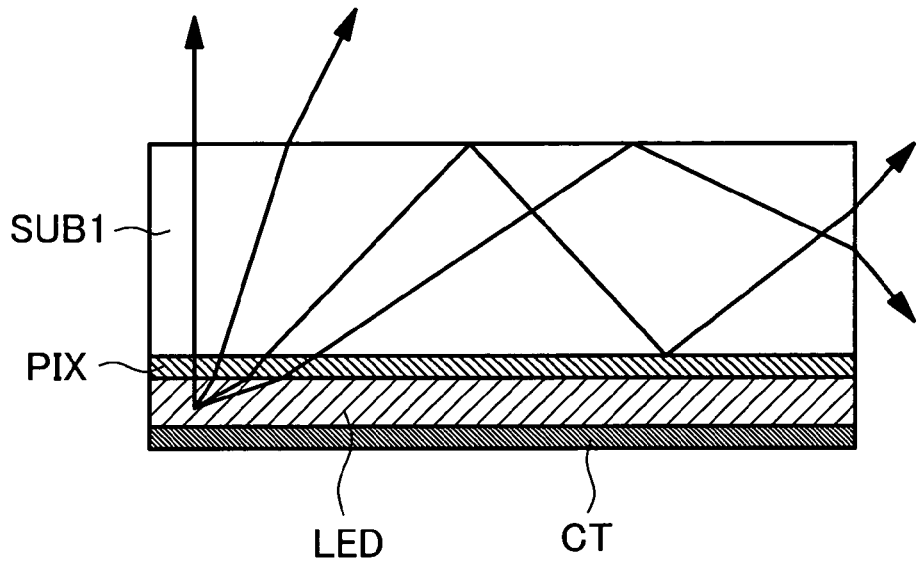
FIG. 4 is an explanatory view showing optical paths of lights in the inside of one substrate (a substrate at a side on which a light emitting layer is formed) of the organic EL display device.

FIG. 4 is a view showing a portion indicated by a circular frame A in FIG. 1 in an enlarged manner. With respect to the stacked structure which is formed on the substrate-SUB2-side surface of the substrate SUB1, for the sake of brevity, only the pixel electrode PIX made of ITO (Indium Tin Oxide), the light emitting layer LED and the counter electrode CT which are stacked in order from the substrate SUB1 side are shown.

Here, assuming the optical reflectance of the substrate SUB1 as 1.5, the optical reflectance of the pixel electrode PIX as 1.9, the optical reflectance of the light emitting layer LED as 1.7, and the optical reflectance of the outside air as 1.0, optical paths of the lights formed of lights which are emitted from the light emitting layer LED and pass through the pixel electrode PIX and the substrate SUB1 are as described in the drawing.

The lights which are irradiated from the light emitting layer LED to the substrate SUB1 side in the direction perpendicular to the substrate SUB1 side and in the directions making slight angles with respect to the above-mentioned direction pass through the substrate SUB1 and reach the viewer side. However, the lights which are irradiated in the directions relatively largely inclined from the direction perpendicular to the substrate SUB side are totally reflected on the surface of the substrate and are guided to the end face side of the substrate SUB1.

With respect to the lights emitted from the light emitting layer LED, while the lights which reach the viewer side are approximately 20%, the lights which are guided to the end wall face side of the substrate SUB1 are approximately 80%. Accordingly, leaking of the light to the end wall face of the substrate SUB1 is blocked by an extension portion which extends to the end wall face of the bank layer BMP.

In the above-mentioned embodiment, a member which is extended to the end wall face of the substrate SUB1 to form the light shielding member is constituted of the bank layer BMP. However, the light shielding member is not always limited to the bank layer BMP and may be constituted of other material layer.

Further, the light shielding member is not limited to the material layer which is formed on the surface of the substrate SUB1 and may be constituted of a member which is formed only for the purpose of shielding the end wall face of the substrate SUB1, for example, an adhesive tape or a resin material. Further, it is needless to say that the constitution which is substantially equal to the above-mentioned constitution may be applied to the substrate SUB2 side besides the substrate SUB1 side.

Figure 5A:
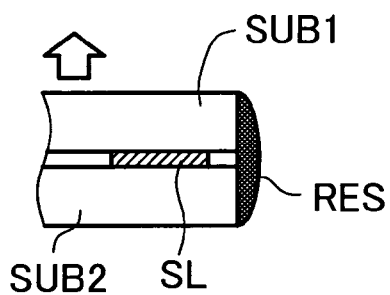
FIGS. 5A and 5B are cross-sectional views of essential parts showing other embodiments of the organic EL display device according to the present invention.
Figure 5B:
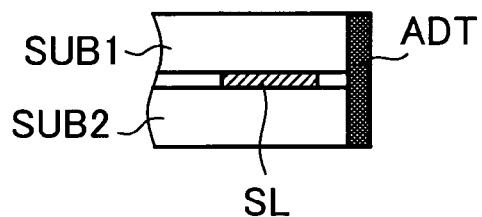

FIG. 5A, FIG. 5B, FIG. 6A and FIG. 6B are constitutional views showing these cases. FIG. 5A shows the case in which the respective end wall faces of the substrates SUB1, SUB2 are shielded from light using a resin material RES by applying the resin material to the respective end wall faces. FIG. 5B shows the case in which an adhesive tape ADT is used in place of the resin material RES.

Figure 6A:
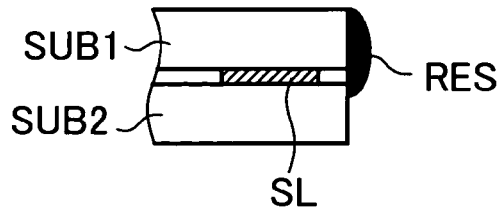
FIGS. 6A and 6B are cross-sectional views of essential parts showing other embodiments of the organic EL display device according to the present invention.
Figure 6B:
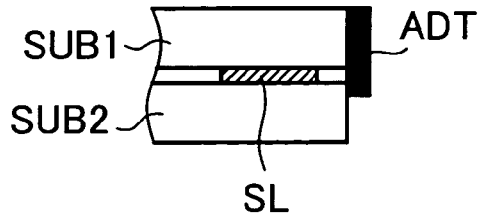

FIG. 6A shows the case in which the resin material RES is applied to the end wall face of only the substrate SUB1. FIG. 6B shows the case in which an adhesive tape ADT is used in place of the resin material RES.

Figure 7A:
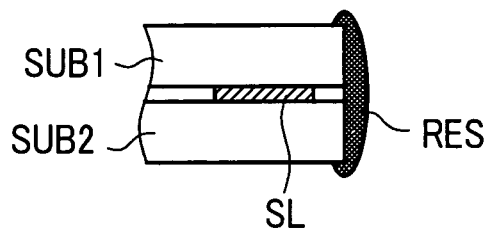
FIGS. 7A-7D are cross-sectional views of essential parts showing other embodiments of the organic EL display device according to the present invention.
Figure 7B:
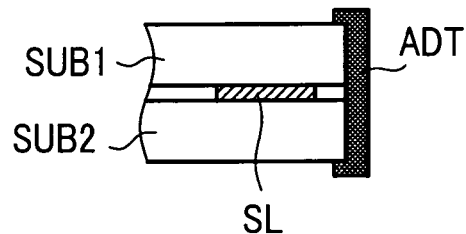
Figure 7C:
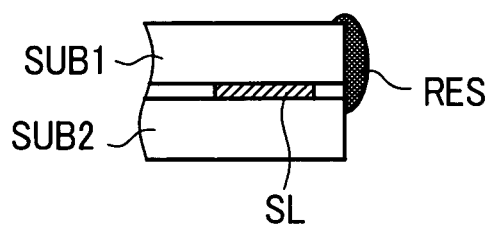
Figure 7D:
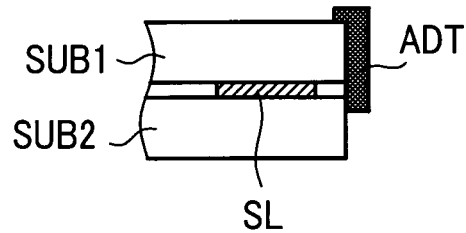

Further, it is needless to say that, as shown in FIG. 7A to FIG. 7D, the formation of the light shielding member is not limited to only the case in which the light shielding member is formed on the end wall face of the substrate, but also the light shielding member may be formed such that the light shielding member extends over the surface around the end wall faces of the substrate. FIG. 7A shows the light shielding member which extends over the surfaces of the substrates SUB1, SUB2 when the resin material RES is applied to the respective end wall faces of the substrates SUB1, SUB2. FIG. 7B shows the case in which an adhesive tape ADT is used in place of the resin material RES. FIG. 7C shows the light shielding member which extends over the surfaces of the substrate SUB1 when the resin material RES is applied to the end wall face of only the substrate SUB1, and FIG. 7D shows the case in which an adhesive tape ADT is used in place of the resin material RES.

Figure 8A:
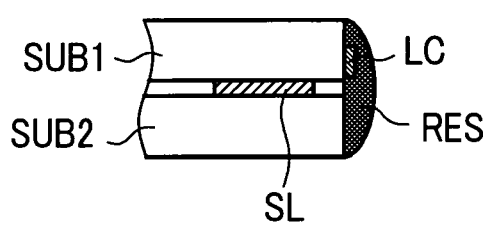
FIGS. 8A and 8B are cross-sectional views of essential parts showing other embodiments of the organic EL display device according to the present invention.
Figure 8B:
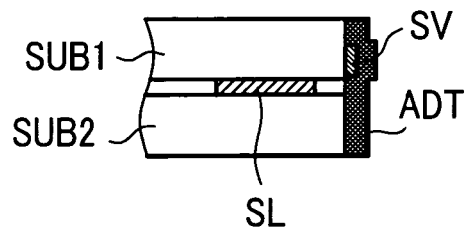

Further, FIG. 8A and FIG. 8B show the constitutions which are provided in view of the fact that a quantity of light irradiated to the end wall faces of the substrate is relatively large. That is, FIG. 8A and FIG. 8B show the constitutions which not only apply the shielding of light to the end wall faces of the substrate but also make effective use of this light.

FIG. 8A shows the constitution in which an optical sensor LC is arranged between the end face of the substrate and the light shielding member and an electric current which is made to flow into the above-mentioned light emitting layer LED, for example, is controlled in response to an output of the optical sensor LC. Further, FIG. 8B shows the constitution in which a solar cell SV is arranged between the end face of the substrate and the light shielding member and an output of the solar cell SV is used for driving the above-mentioned light emitting layer LED.

The above-mentioned respective embodiments may be used in a single form or in combination. It is because advantageous effects of the respective embodiments can be obtained in a single form or synergistically.

What is claimed is:

1. An organic electroluminescent display device comprising:
    a first substrate;
    a second substrate which faces a display part of the first substrate on which light emitting layers are formed in an opposed manner, said second substrate being fixed to the first substrate using a sealing material which surrounds the display part, and
    a light shielding member arranged so as to directly contact respective end wall faces of peripheries of the first substrate and the second substrate and preventing the light which is emitted from the light emitting layer and irradiated through the substrate from being leaked through said end wall faces, said end wall faces being perpendicular to planer faces of the substrates and being located outside of an area sealed by the sealing material.

2. An organic electroluminescent display device according to claim 1, wherein the light emitting layer is formed on a portion of each pixel region and a bank layer is formed between the light emitting layer and the light emitting layer of another pixel region arranged adjacent to the light emitting layer, said bank layer is formed by resin material containing black pigment, and said light shielding member on the end wall faces of periphery of the second substrate is formed as the same material as said bank layer.

3. An organic electroluminescent display device according to claim 1, wherein the light shielding member is a resin member.

4. An organic electroluminescent display device according to claim 1, wherein the light shielding member is an adhesive tape.

5. An organic electroluminescent display device according to claim 1, wherein the light shielding member is formed by extending a material formed on the substrate to an end wall face of the substrate.

6. An organic electroluminescent display device comprising:

a first substrate;

a second substrate which faces a display part of the first substrate on which light emitting layers are formed in an opposed manner, said second substrate being fixed to the first substrate using a sealing material which surrounds the display part, and a resin material or an adhesive tape arranged so as to directly contact respective end wall faces of peripheries of the first substrate and the second substrate and preventing the light which is emitted from the light emitting layer and irradiated through the substrate from being leaked through said end wall faces, said end wall faces being perpendicular to planer faces of the substrates and being located outside of an area sealed by the sealing material.

7. An organic electroluminescent display device according to claim 6, wherein the light emitting layer is formed on a portion of each pixel region and a bank layer is formed between the light emitting layer and the light emitting layer of another pixel region arranged adjacent to the light emitting layer, said bank layer is formed by resin material containing black pigment, and said resin material on the end wall faces of periphery of the second substrate is formed as the same material as said bank layer.

* * * * *